United States Patent
Chen (10) Patent No.: US 9,107,290 B1
(45) Date of Patent: Aug. 11, 2015

(54) PACKAGE STRUCTURE AND STACKED PACKAGE MODULE WITH THE SAME

(71) Applicant: Delta Electronics Int'l (Singapore) Pte Ltd, Singapore (SG)

(72) Inventor: Da-Jung Chen, Singapore (SG)

(73) Assignee: DELTA ELECTRONICS INT'L (SINGAPORE) PTE LTD, Singapore (SG)

( * ) Notice: Subject to any disclaimer, the term of this patent is extended or adjusted under 35 U.S.C. 154(b) by 0 days.

(21) Appl. No.: 14/230,941

(22) Filed: Mar. 31, 2014

(30) Foreign Application Priority Data

Mar. 5, 2014  (SG) .......................... 10201400396W (51) Int. Cl.
| H01L 23/495 | (2006.01) |
| H05K 3/00 | (2006.01) |
| H05K 1/02 | (2006.01) |

(52) U.S. Cl.
CPC ............ *H05K 3/0061* (2013.01); *H05K 1/0204* (2013.01); *H05K 2201/10598* (2013.01)

(58) Field of Classification Search
CPC .................. H05K 3/0061; H05K 2201/10598; H05K 1/0204
See application file for complete search history.

(56) References Cited

U.S. PATENT DOCUMENTS

| 6,628,526 | B1 | 9/2003 | Oshima et al. |
| 7,572,681 | B1 | 8/2009 | Huemoeller et al. |
| 7,738,256 | B2 | 6/2010 | Sawatari et al. |
| 7,989,944 | B2 | 8/2011 | Tuominen |
| 8,026,614 | B2 | 9/2011 | Kawabata et al. |
| 8,072,769 | B2 | 12/2011 | Ieki et al. |
| 8,381,394 | B2 | 2/2013 | Shizuno |
| 2005/0212078 | A1 | 9/2005 | Kwon et al. |
| 2009/0302435 | A1* | 12/2009 | Pagaila et al. ................ 257/659 |
| 2012/0319258 | A1 | 12/2012 | Lu et al. |
| 2013/0027896 | A1 | 1/2013 | Lee et al. |
| 2013/0093069 | A1 | 4/2013 | Lu et al. |
| 2013/0292826 | A1* | 11/2013 | Lin et al. ....................... 257/737 |

* cited by examiner

*Primary Examiner* — Yasser A Abdelaziez
*Assistant Examiner* — Hajar Kolahdouzan
(74) *Attorney, Agent, or Firm* — Kirton McConkie; Evan R. Witt (57) ABSTRACT

A package structure includes two insulation layers, three conductive layers, and two electronic components. The first and second conductive layers are disposed on a top surface and a bottom surface of the first insulation layer, respectively. The second insulation layer is disposed over the first conductive layer. The third conductive layer is disposed on a top surface of the second insulation layer. The first and second electronic components are embedded within the first and second insulation layers, respectively. The first conducting terminals of the first electronic component are electrically connected with the first conductive layer and the second conductive layer through at least one first conductive via and at least one second conductive via. The second conducting terminals of the second electronic component are electrically connected with the first conductive layer and/or electrically connected with the third conductive layer through at least one third conductive via.

20 Claims, 10 Drawing Sheets

PACKAGE STRUCTURE AND STACKED PACKAGE MODULE WITH THE SAME

FIELD OF THE INVENTION

The present invention relates to a package structure, and more particularly to a package structure having a plurality of insulation layers embedded with plural electronic components and including at least one embedded thermal conduction structure for dissipating heat away from plural electronic components so as to enhance the heat dissipating efficiency. The present invention also relates to a stacked package module with such package structure.

BACKGROUND OF THE INVENTION

Recently, the general trends in designing electronic devices are toward small size, light weightiness and easy portability. Moreover, with the increasing development of electronic industries, the internal circuitries of the electronic devices are gradually modularized. In other words, plural electronic components are integrated into a single circuit module. For example, a power module is one of the widely-used circuit modules. An example of the power module includes a DC-to-DC converter, a DC-to-AC converter, an AC-to-DC converter, or the like. After the electronic components (e.g. capacitors, resistors, inductors, transformers, diodes and transistors) are integrated as a power module, the power module may be installed on a motherboard or a system circuit board.

Conventionally, the package structures of the power module are classified into three types. The first type of package structure is a single in-line package structure (SIP structure). After active components and passive components are mounted on a printed circuit board (PCB) or a substrate, a single row of leads are protruded from a side of the package structure by using a lead frame. The method of fabricating the single in-line package structure is easy by simply welding electronic components on the printed circuit board. Moreover, since the layout area of the single in-line package structure is large, the capability to withstand heat and the heat dissipating efficacy are both good. However, in addition to the active components, the traces of the printed circuit board or the substrate and safety distances between the electronic components may influence the overall area of the package structure. In other words, the area of the single in-line package structure is very large and occupies much space of the electronic device. Moreover, since all active components need to be previously packaged and the layout area is large, the overall fabricating cost is high. Moreover, since the single in-line package structure is manually installed on the system circuit board, the assembling process of the single in-line package structure is time-consuming and labor-intensive.

The second type of package structure is a land grid array (LGA) package structure. After the electronic components and the traces are installed on a printed circuit board, the electronic components and the traces are packaged by a molding process. In addition, plural contact pads are formed on a backside of the printed circuit board in order to be electrically connected with external device. In other words, the LGA package structure has a smaller layout area, a small overall volume and high density integration, and the method of fabricating the LGA package structure is simple and cost-effective. Moreover, the LGA package structure may be installed on a system circuit board by a surface mount technology (SMT). However, since the electronic components are arranged on the same layer of the printed circuit board, the traces between electronic components are still long. Under this circumstance, the line impedance is high, and a parasitic effect is easily generated. In other words, the electrical properties are possibly unsatisfied. Moreover, since the LGA package structure is only about to dissipate heat in a single direction, the heat dissipating efficiency is insufficient.

The third type of package structure is a ball grid array (BGA) package structure. Except that the signal output points of the BGA package structure are solder balls, the BGA package structure is similar to the LGA package structure. Since the BGA package structure has the solder balls, it is not necessary to print sold paste. That is, by simply printing flux, the BGA package structure may be installed on a system circuit board. In comparison with the LGA package structure, the BGA package structure is less prone to poor welding. However, since the process of forming the solder balls is complicated and expensive, the BGA package structure is not cost-effective. Moreover, the heat dissipating efficiency is still insufficient.

Moreover, each of the above three package structures is a single-layered structure. In other words, the active components and the passive components may only be disposed on the same layer of the printed circuit board. Since the layout space of the printed circuit board is limited, the power density of the power module with each of the above three package structures is insufficient.

Therefore, there is a need of providing an improved package structure and a stacked package module with the package structure in order to eliminate the above drawbacks.

SUMMARY OF THE INVENTION

The present invention provides a package structure with embedded thermal conduction structure. The heat generated by the electronic component can be transferred to the surroundings of the package structure through the low thermal resistance paths of the conductive layers and the thermal conduction structure along vertical and horizontal directions so that the heat dissipating efficiency is enhanced and the fabricating cost is reduced.

The present invention provides a package structure for packaging electronic components in high density integration by using a surface mount technology (SMT).

The present invention also provides a stacked package module with several package structures in a stacked form in order to increase the power density and reduce the size.

An aspect of the present invention provides a package structure. The package structure includes a first insulation layer, a first conductive layer, a second conductive layer, at least one first electronic component, a second insulation layer, a third conductive layer, and at least one second electronic component. At least one first conductive via and at least one second conductive via are formed in the first insulation layer. The first conductive layer is disposed on a top surface of the first insulation layer and contacted with said at least one first conductive via. The second conductive layer is disposed on a bottom surface of the first insulation layer and contacted with said at least one second conductive via. Said at least one first electronic component is embedded within the first insulation layer, and includes plural first conducting terminals. The plural first conducting terminals are electrically connected with the first conductive layer and the second conductive layer through said at least one first conductive via and said at least one second conductive via. The second insulation layer is disposed over the first conductive layer and covers the first conductive layer. Moreover, at least one third conductive via is formed in the second insulation layer. The third conductive layer is disposed on a top surface of the second insulation layer and contacted with said at least one third conductive via. Said at least one second electronic component is embedded within the second insulation layer and connected to the first conductive layer via an adhesive material, and includes plural second conducting terminals. The plural second conducting terminals are electrically connected with the first conductive layer and/or electrically connected with the third conductive layer through said at least one third conductive via.

Another aspect of the present invention provides a stacked package module. The stacked package module includes plural package structures. Each package structure includes a first insulation layer, a first conductive layer, a second conductive layer, at least one first electronic component, a second insulation layer, a third conductive layer, and at least one second electronic component. At least one first conductive via and at least one second conductive via are formed in the first insulation layer. The first conductive layer is disposed on a top surface of the first insulation layer and contacted with said at least one first conductive via. The second conductive layer is disposed on a bottom surface of the first insulation layer and contacted with said at least one second conductive via. Said at least one first electronic component is embedded within the first insulation layer, and includes plural first conducting terminals. The first conducting terminal is electrically connected with the first conductive layer and the second conductive layer through said at least one first conductive via and said at least one second conductive via. The second insulation layer is disposed over the first conductive layer and covers the first conductive layer. Moreover, at least one third conductive via is formed in the second insulation layer. The third conductive layer is disposed on a top surface of the second insulation layer and contacted with said at least one third conductive via. Said at least one second electronic component is embedded within the second insulation layer and connected to the first conductive layer via an adhesive material, and includes plural second conducting terminals. The plural second conducting terminals are electrically connected with the first conductive layer and/or electrically connected with the third conductive layer through said at least one third conductive via. The plural package structures are stacked on each other. The second conductive layer of each package structure is electrically connected with the third conductive layer of the adjacent package structure.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
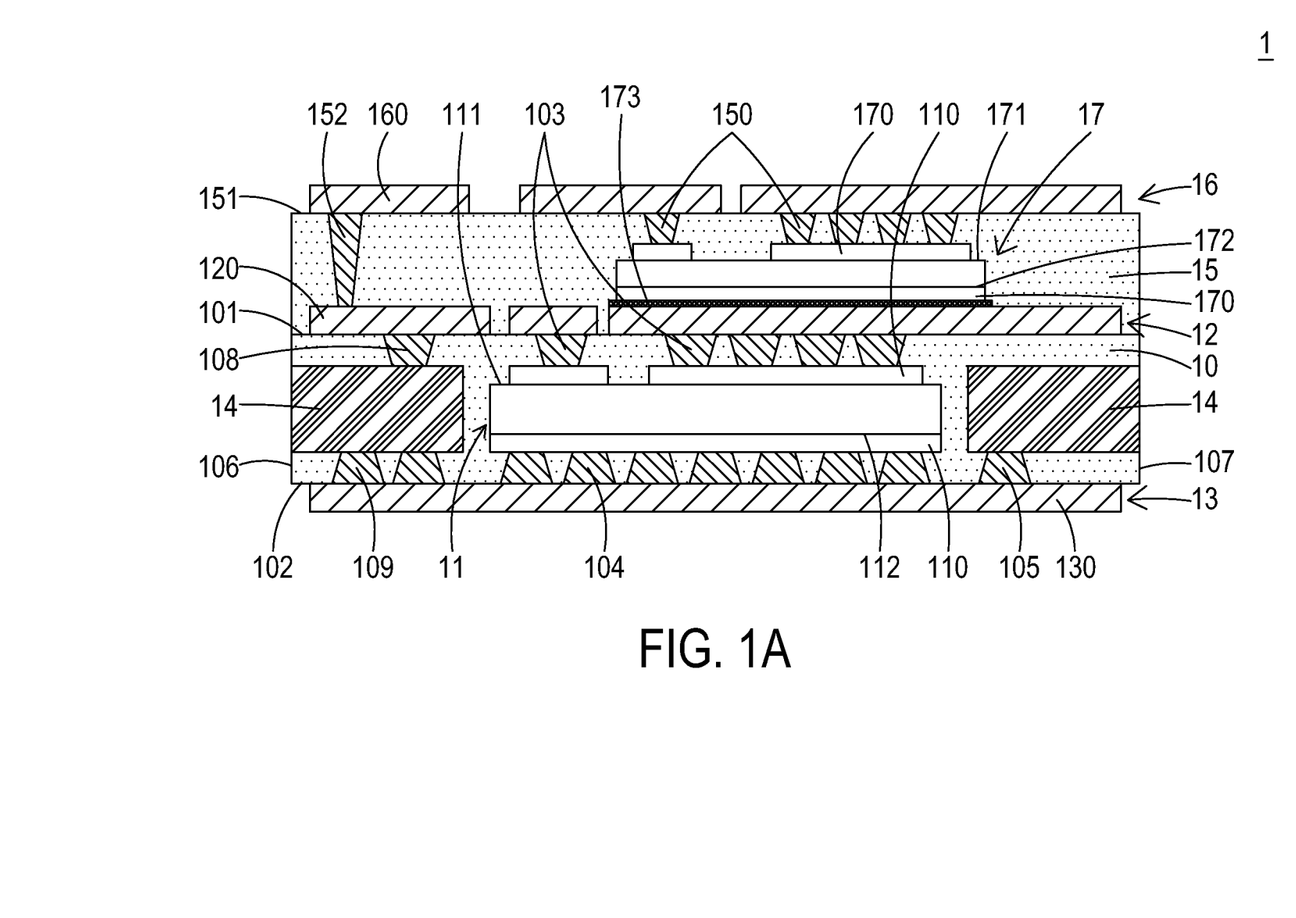
FIG. 1A is a schematic cross-sectional view illustrating a package structure according to a first embodiment of the present invention.

FIG. 1A is a schematic cross-sectional view illustrating a package structure according to a first embodiment of the present invention. The package structure 1 is a surface mount device (SMD) package structure. As shown in FIG. 1A, the package structure 1 includes a first insulation layer 10, at least one first electronic component 11, a first conductive layer 12, a second conductive layer 13, a second insulation layer 15, a third conductive layer 16, and at least one second electronic component 17. Moreover, plural first conductive vias 103 and plural second conductive vias 104 are formed in the first insulation layer 10. The first conductive layer 12 is disposed on a top surface 101 of the first insulation layer 10. The first conductive layer 12 is contacted with the plural first conductive vias 103. The second conductive layer 13 is disposed on a bottom surface 102 of the first insulation layer 10. In addition, a part of the bottom surface 102 of the first insulation layer 10 is exposed outside. The second conductive layer 13 is contacted with the plural second conductive vias 104. The first electronic component 11 is embedded within the first insulation layer 10. Moreover, the first electronic component 11 includes plural first conducting terminals 110. The first conducting terminal 110 on a top surface 111 of the first electronic component 11 is contacted with the corresponding first conductive vias 103. The first conducting terminal 110 on a bottom surface 112 of the first electronic component 11 is contacted with the corresponding second conductive vias 104. Consequently, the first electronic component 11 is electrically connected with the first conductive layer 12 and the second conductive layer 13 through the plural first conducting terminals 110, the first conductive vias 103 and the second conductive vias 104. The second insulation layer 15 is disposed on the first conductive layer 12 and covers the first conductive layer 12. Moreover, plural third conductive vias 150 are formed in the second insulation layer 15. The third conductive layer 16 is disposed on a top surface 151 of the second insulation layer 15. In addition, a part of the top surface 151 of the second insulation layer 15 is exposed outside. The third conductive layer 16 is contacted with the plural third conductive vias 150. The second electronic component 17 is embedded within the second insulation layer 15. Moreover, the second electronic component 17 is directly disposed on the first conductive layer 12. Moreover, the second electronic component 17 includes plural second conducting terminals 170. The second conducting terminal 170 on a top surface 171 of the second electronic component 17 is contacted with the corresponding third conductive vias 150. The second conducting terminal 170 on a bottom surface 172 of the second electronic component 17 is directly disposed on the first conductive layer 12 and contacted with the first conductive layer 12. Consequently, the second electronic component 17 is electrically connected with the third conductive layer 16 through the second conducting terminal 170 on the top surface 171 of the second electronic component 17 and the corresponding third conductive vias 150, and/or the second electronic component 17 is electrically connected with the first conductive layer 12 through the second conducting terminal 170 on the bottom surface 172 of the second electronic component 17. Moreover, since the first electronic component 11 is electrically connected with the first conductive layer 12 and the second electronic component 17 is also electrically connected with the first conductive layer 12, the first electronic component 11 and the second electronic component 17 are electrically connected with each other through the first conductive layer 12.

In an embodiment, for example, each of the first insulation layer 10 and the second insulation layer 15 is (but not limited to) made of resin or any other appropriate insulation material with high thermal conductivity. Moreover, the plural first conductive vias 103 are formed in the first insulation layer 10, exposed to the top surface 101 of the first insulation layer 10, and in contact with the first conductive layer 12. The plural second conductive vias 104 are formed in the first insulation layer 10, exposed to the bottom surface 101 of the first insulation layer 10, and in contact with the second conductive layer 13. The plural third conductive vias 150 are formed in the second insulation layer 15, exposed to the top surface 151 of the second insulation layer 15, and in contact with the third conductive layer 16. The method of forming the plural first conductive vias 103, the plural second conductive vias 104 and the plural third conductive vias 150 are well known to those skilled in the art. For example, after plural vias are formed in the first insulation layer 10 and the second insulation layer 15 by a laser drilling process, a mechanical drilling process or a photolithography process and a conductive material is formed in the plural vias by a filling process or an electroplating process, the plural first conductive vias 103, the plural second conductive vias 104 and the plural third conductive vias 150 are formed.

Moreover, by etching the first conductive layer 12, the second conductive layer 13 and the third conductive layer 16, one or more separate first conductive patterns 120, one or more separate second conductive patterns 130 and one or more third conductive patterns 160 are formed. In this embodiment as shown in FIG. 1A, the first conductive layer 12 includes three separate first conductive patterns 120, the second conductive layer 13 includes one second conductive pattern 130, and the third conductive layer 16 includes three third conductive patterns 160. The first conductive patterns 120 are contacted with the corresponding first conductive vias 103, the second conductive pattern 130 is contacted with the corresponding second conductive vias 104, and the third conductive patterns 160 are contacted with the corresponding third conductive vias 150. In an embodiment, the second electronic component 17 is connected to the first conductive layer 12 by soldering, Ag sintering, diffusion soldering or non-conductive adhesive, but it is not limited thereto. The soldering process is: the second electronic component 17 and the first conductive layer 12 are joined together by melting and flowing an adhesive material (solder) 173 into the joint. The adhesive material 173 is, for example, Ag paste.

Moreover, the first conductive layer 12, the second conductive layer 13 and the third conductive layer 16 are made of copper or any other appropriate conductive material, but it is not limited thereto. For example, after the conductive material is electroplated or deposited on the top surface 101 of the first insulation layer 10, the bottom surface 102 of the first insulation layer 10 and the top surface 151 of the second insulation layer 15, the first conductive layer 12, the second conductive layer 13 and the third conductive layer 16 are formed. The third conductive patterns 160 and the second conductive pattern 130 may be served as contact pads of the package structure 1. Consequently, the package structure 1 may be mounted on a system circuit board (not shown) by a surface mount technology (SMT).

The first electronic component 11 and the second electronic component 17 are active components or passive components. The examples of the first electronic component 11 and the second electronic component 17 include but are not limited to chips, integrated power components, metal-oxide-semiconductor field-effect transistors (MOSFETs), insulated-gate bipolar transistors (IGBTs), diodes, capacitors, resistors, inductors or fuses. The first electronic component 11 is embedded within the first insulation layer 10, and arranged between the plural first conductive vias 103 and the plural second conductive vias 104. The first conducting terminal 110 on the top surface 111 of the first electronic component 11 is electrically connected with the corresponding first conductive pattern 120 through the corresponding first conductive via 103. The first conducting terminal 110 on the bottom surface 112 of the first electronic component 11 is electrically connected with the corresponding second conductive pattern 130 through the corresponding second conductive via 104. The second electronic component 17 is embedded within the second insulation layer 15, and arranged between the plural third conductive vias 150 and the first conductive layer 12. The second conducting terminal 170 on the top surface 171 of the second electronic component 17 is electrically connected with the corresponding third conductive pattern 160 through the corresponding third conductive via 150. The second conducting terminal 170 on the bottom surface 172 of the second electronic component 17 is directly disposed on the corresponding first conductive pattern 120 and electrically connected with the corresponding first conductive pattern 120. Consequently, the third conductive patterns 160 and the second conductive pattern 130 are served as the contact pads of the package structure 1. After the package structure 1 may be mounted on a system circuit board (not shown) by a surface mount technology (SMT), the first conducting terminals 110 of the first electronic component 11 and the second conducting terminals 170 of the second electronic component 17 are electrically connected with the electronic components (not shown) or traces (not shown) of the system circuit board through the second conductive pattern 130 and the third conductive patterns 160.

In this embodiment, the first electronic component 11 and the second electronic component 17 are metal-oxide-semiconductor field-effect transistors (MOSFETs). That is, the first electronic component 11 has three first conducting terminals 110, and the second electronic component 17 has three second conducting terminals 170. As shown in FIG. 1A, two of the first conducting terminals 110 are formed on the top surface 111 of the first electronic component 11, and one of the first conducting terminals 110 is formed on the bottom surface 112 of the first electronic component 11. The three first conducting terminals 110 include a gate terminal, a source terminal and a drain terminal. That is, two of the gate terminal, the source terminal and the drain terminal are formed on the top surface 111 of the first electronic component 11, and the other one of the gate terminal, the source terminal and the drain terminal is formed on the bottom surface 112 of the first electronic component 11. Moreover, two of the second conducting terminals 170 are formed on the top surface 171 of the second electronic component 17, and one of the second conducting terminals 170 is formed on the bottom surface 172 of the second electronic component 17. That is, two of the gate terminal, the source terminal and the drain terminal are formed on the top surface 171 of the second electronic component 17, and the other one of the gate terminal, the source terminal and the drain terminal is formed on the bottom surface 172 of the second electronic component 17.

In some embodiments, the package structure 1 further includes at least one thermal conduction structure 14. For example, as shown in FIG. 1, the package structure 1 includes plural thermal conduction structures 14. The plural thermal conduction structures 14 are embedded within the first insulation layer 10 and located at said at least one lateral side of the first electronic component 11, for example, located at the horizontal both sides of the first electronic component 11. Moreover, a part of the thermal conduction structure 14 is exposed outside the first insulation layer 10. Consequently, the heat generated by the first electronic component 11 may be transferred to the surroundings of the package structure 1 through the thermal conduction structure 14.

In this embodiment, two thermal conduction structures 14 are embedded within the first insulation layer 10 and located at one side of the first electronic component 11, respectively. In an embodiment as shown in FIG. 1A, two thermal conduction structures 14 are (but not limited to) located at the horizontal sides of the first electronic component 11. Moreover, the two thermal conduction structures 14 are respectively exposed to a first side 106 and a second side 107 of the first insulation layer 10, wherein the first side 106 and the second side 107 are opposed to each other. Consequently, the heat generated by the first electronic component 11 may be transferred to the surroundings of the package structure 1 through the thermal conduction structures 14. In some embodiments, the plural thermal conduction structures 14 are implemented by a single metallic lead frame, and the plural thermal conduction structures 14 are arranged around the first electronic component 11. Consequently, the plural thermal conduction structures 14 made of metallic materials can not only be used to transfer heat from the first electronic component 11 to the surroundings, but also be used to convey electricity. Moreover, said at least one thermal conduction structure 14 can be disposed at the four sides of the first electronic element 11. Consequently, the heat generated by the first electronic component 11 can be transferred to the surroundings of the package structure 1 in horizontal direction. In addition, the plural thermal conduction structures 14 are not limited to be implemented by a single metallic lead frame. In some other embodiments, the plural thermal conduction structures 14 are implemented by a ceramic substrate with thermal conduction property. Alternatively, the plural thermal conduction structures 14 are implemented by other appropriate material or substrate with thermal conduction property.

Moreover, the plural thermal conduction structures 14 are separated from each other. That is, the plural thermal conduction structures 14 are not electrically connected with each other. Moreover, the thicknesses of the thermal conduction structures 14, the first conductive layer 12, the second conductive layer 13 and the third conductive layer 16 are not limited and can be determined according to the thickness of the first electronic component 11, the thickness of the second electronic component 17 and the heat dissipating requirement of the package structure 1.

In this embodiment, said at least one thermal conduction structure 14 is embedded within the first insulation layer 10. Alternatively, in some other embodiment, said at least one thermal conduction structure 14 is embedded within the second insulation layer 15 (not shown in FIG. 1A). Alternatively, in some other embodiment, said at least one thermal conduction structure 14 is embedded within the first insulation layer 10 and the second insulation layer 15 simultaneously. In case that said at least one thermal conduction structures 14 is embedded within the second insulation layer 15, said at least one thermal conduction structure 14 is located at said at least one lateral side of the second electronic component 17, for example located at one of four sides of the second electronic component 17. Moreover, a part of the thermal conduction structure 14 is exposed outside the second insulation layer 15. Consequently, the heat generated by the second electronic component 17 may be transferred to the surroundings of the package structure 1 through said at least one thermal conduction structure 14.

Figure 1B:
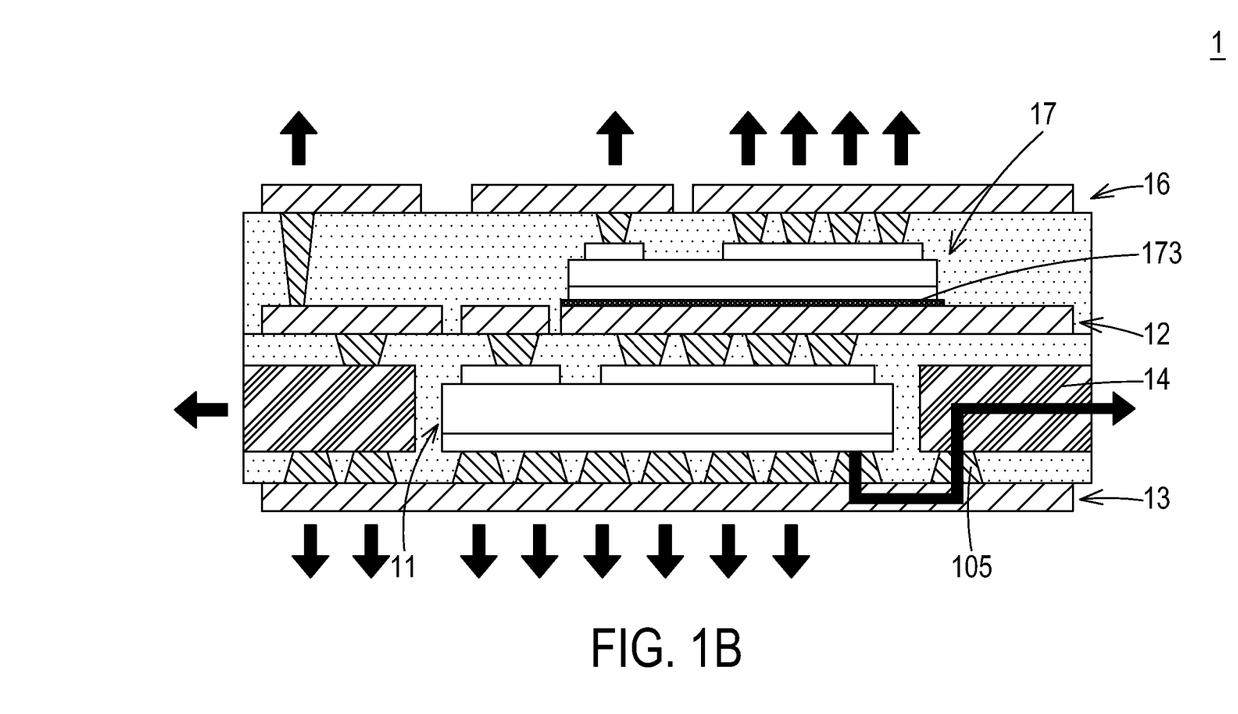
FIG. 1B shows the heat-dissipating directions of the package structure of FIG. 1A.
Figure 1C:
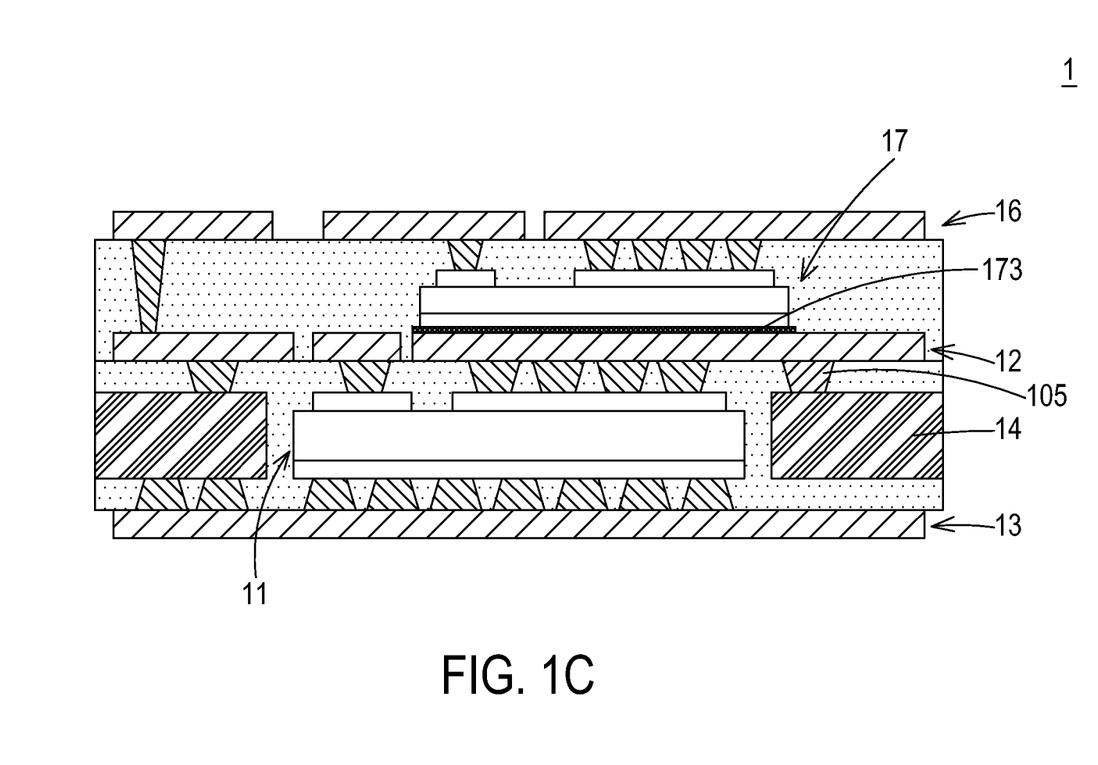
FIG. 1C is a schematic cross-sectional view illustrating a variant example of the package structure of FIG. 1A.

FIG. 1B shows the heat-dissipating directions of the package structure of FIG. 2A. As shown in FIGS. 1A and 1B, in this embodiment, the package structure 1 further includes at least one fourth conductive via 105 formed in the first insulation layer 10. A first end of the fourth conductive via 105 is contacted with the second conductive layer 13, and the second end of the fourth conductive via 105 is contacted with the corresponding thermal conduction structure 14. After the heat generated by the first electronic component 11 is transferred to the second conductive layer 13, a portion of the heat may be transferred to the corresponding thermal conduction structure 14 through the fourth conductive via 105. In addition, the heat generated by the first electronic component 11 and the second electronic component 17 can be vertically transferred to the upper side and lower side of the surroundings of the package structure 1 through the third conductive layer 16 and the second conductive layer 13. The heat generated by the first electronic component 11 and the second electronic component 17 can be transferred to the surroundings of the package structure 1 along the arrow directions as indicated in FIG. 1B. Consequently, the heat dissipating efficacy is further increased. Alternatively, in some other embodiments as shown in FIG. 1C, the first end of the fourth conductive via 105 is contacted with the first conductive layer 12, and a second end of the fourth conductive via 105 is contacted with the corresponding thermal conduction structure 14. After the heat generated by the first electronic component 11 is transferred to the first conductive layer 12, a portion of the heat may be transferred to the corresponding thermal conduction structure 14 through the fourth conductive via 105. Consequently, the heat dissipating efficacy is further increased.

Please refer to FIG. 1A again. The first insulation layer 10 of the package structure 1 further includes at least one fifth conductive via 108 and at least one sixth conductive via 109. A first end of the fifth conductive via 108 is connected with the corresponding first conductive pattern 120, and a second end of the fifth conductive via 108 is connected with the corresponding thermal conduction structure 14. A first end of the sixth conductive via 109 is connected with the corresponding second conductive pattern 130, and a second end of the sixth conductive via 109 is connected with the corresponding thermal conduction structure 14. Consequently, the heat generated by the electronic component 11 may be vertically transferred to the surroundings of the package structure 1 through the thermal conduction path of the fifth conductive via 108, the sixth conductive via 109 and the thermal conduction structure 14. Consequently, the heat dissipating efficacy is further increased. Moreover, the corresponding first conductive pattern 120 and the corresponding second conductive pattern 130 are electrically connected with each other through the fifth conductive via 108, the sixth conductive via 109 and the thermal conduction structure 14. The second insulation layer 15 further includes at least one seventh conductive via 152. A first end of the seventh conductive via 152 is connected with the corresponding third conductive pattern 160, and a second end of the seventh conductive via 152 is connected with the corresponding first conductive pattern 120. When the heat generated by the electronic component 11 is transferred to the first conductive layer 12, the heat may be further transferred to the surroundings of the package structure 1 through the seventh conductive via 152 and the third conductive layer 16. Consequently, the heat dissipating efficacy is further increased. Moreover, the first conductive layer 12 and the third conductive layer 16 are electrically connected with each other through the seventh conductive via 152. In case that the second conducting terminal 170 of the second electronic component 17 is disposed on the portion of the first conductive layer 12 which is contacted with the seventh conductive via 152, the second conducting terminal 170 of the second electronic component 17 may be electrically connected with the third conductive layer 16 through the seventh conductive via 152 (see FIG. 2). The methods of forming the fourth conductive via 105, the fifth conductive via 108, the sixth conductive via 109 and the seventh conductive via 152 are similar to the methods of forming the first conductive vias 103 and the second conductive vias 104, and are not redundantly described herein.

As mentioned above, the first conducting terminals 110 of the first electronic component 11 are electrically connected with the corresponding first conductive patterns 120 and/or the corresponding second conductive pattern 130 through the corresponding first conductive vias 103 and/or the corresponding second conductive vias 104. In addition, the second conducting terminals 170 of the second electronic component 17 are electrically connected with the corresponding first conductive patterns 120 and/or electrically connected with the corresponding third conductive pattern 160 through the corresponding third conductive vias 150. In addition, the first conductive layer 12 and the third conductive layer 16 are electrically connected with each other through the seventh conductive via 152. One or more thermal conduction and electrical conduction paths can be formed among the first conducting terminals 110 of the first electronic component 11, the corresponding first conductive vias 103 and/or the corresponding second conductive vias 104, and the corresponding first conductive patterns 120 and/or the corresponding second conductive pattern 130. In addition, other thermal conduction and electrical conduction paths can also be formed among the second conducting terminals 170 of the second electronic component 17, the corresponding first conductive patterns 120, the corresponding third conductive vias 105 and the corresponding third conductive pattern 160. Consequently, the heat generated by the first electronic component 11 and the second electronic component 17 may be vertically transferred to the upper side and the lower side of the surroundings of the package structure 1 through the third conductive patterns 160 and the second conductive pattern 130. In addition, said at least one thermal conduction structure 14 is disposed at said at least one lateral side of the first electronic component 11. In an embodiment as shown in FIG. 1A, two thermal conduction structures 14 are located at the horizontal both sides of the first electronic component 11, respectively. Consequently, the heat generated by the first electronic component 11 may be horizontally transferred to the surroundings of the package structure 1 through the two thermal conduction structures 14 that are arranged at the first side 106 and the second side 107 of the first insulation layer 10. Under this circumstance, the heat generated by the first electronic component 11 and the second electronic component 17 can be transferred to the surroundings of the package structure 1 through the low thermal resistance paths along vertical and horizontal directions. Consequently, the heat dissipating efficacy of the package structure 1 is largely enhanced. Moreover, since the third conductive layer 16 on the top surface 151 of the second insulation layer 15 and the second conductive layer 13 on the bottom surface 102 of the first insulation layer 10 are served as the contact pads of the package structure 1, the third conductive layer 16 and the second conductive layer 13 may be used as the electrical conduction paths and thermal conduction paths at the top side and the bottom side of the first electronic device 11. In other words, the package structure 1 has the functions of bilaterally conducting electricity and bilaterally dissipating heat.

Moreover, since the thermal conduction structures 14 are embedded within the first insulation layer 10 and/or the second insulation layer 15 and implemented by the metallic lead frame, the overall mechanical strength of the package structure 1 is increased, and the possibility of causing deformation of the package structure 1 is minimized. Moreover, since the package structure 1 is a multilayered structure including the first insulation layer 10 and the second insulation layer 15, the first electronic component 11 and the second electronic component 17 are embedded within the first insulation layer 10 and the second insulation layer 15, respectively. Since the first electronic component 11 and the second electronic component 17 are located at different levels with respect to the printed circuit board, the distance between the first electronic component 11 and the second electronic component 17 is effectively shortened. Under this circumstance, the on-resistance is effectively reduced, the parasitic effect is reduced, the electrical property is enhanced, and the overall power density of the package structure 1 is increased.

It is noted that numerous modifications and alterations of the package structure 1 may be made while retaining the teachings of the invention. Hereinafter, some variant examples of the package structure 1 will be illustrated with reference to FIGS. 2-8. Component parts and elements corresponding to those of the first embodiment are designated by identical numeral references, and detailed descriptions thereof are omitted.

Figure 2:
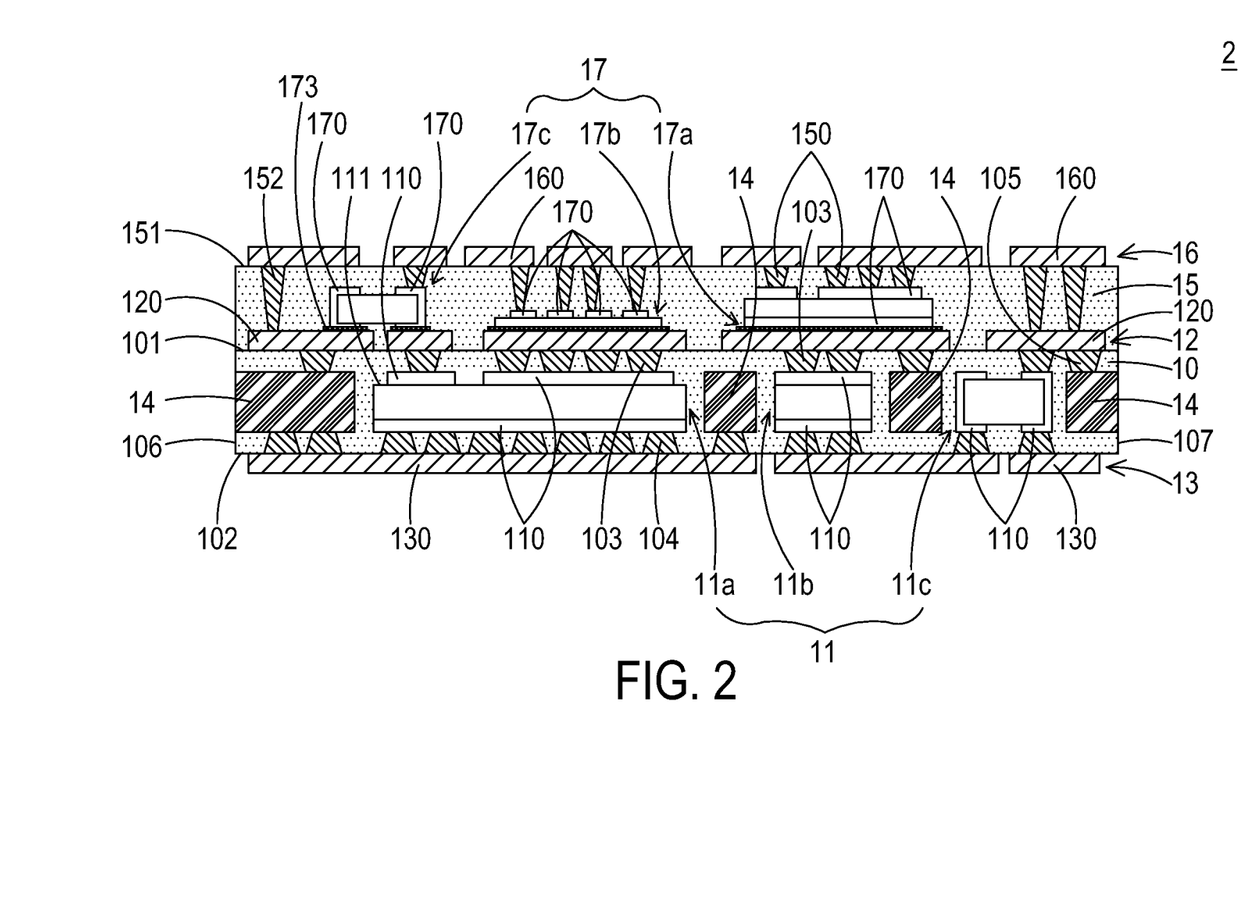
FIG. 2 is a schematic cross-sectional view illustrating a package structure according to a second embodiment of the present invention.
Figure 5:
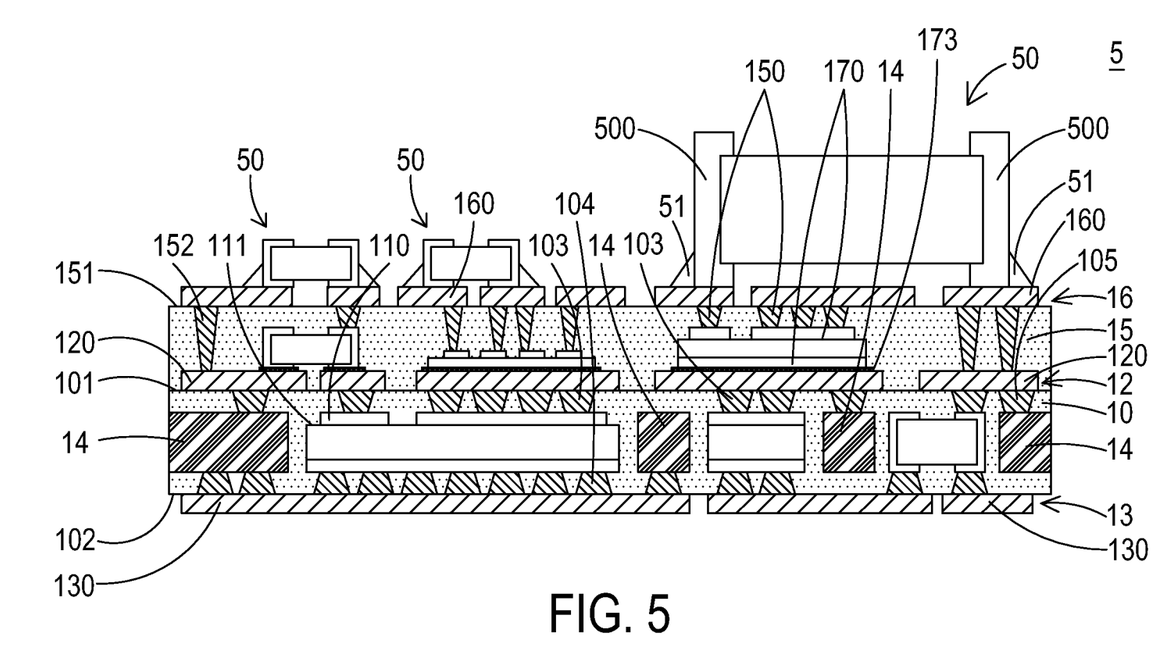
FIG. 5 is a schematic cross-sectional view illustrating a package structure according to a fifth embodiment of the present invention.

FIG. 2 is a schematic cross-sectional view illustrating a package structure according to a second embodiment of the present invention. In comparison with the first embodiment shown in FIG. 1A, the package structure 2 of this embodiment includes plural first electronic components 11 (for example, three first electronic components 11a, 11b and 11c) and plural second electronic components 17 (for example, three second electronic components 17a, 17b and 17c). The first electronic components 11 can be same or different with each other, and the second electronic components 17 can be same or different with each other. The number of the first conducting terminals 110 of each first electronic component 11 and the number of the second conducting terminals 170 of each second electronic component 17 are determined according to the types of the first electronic component 11 and the second electronic component 17. If the first electronic component 11 is a metal-oxide-semiconductor field-effect transistor (MOSFET), the first electronic component 11 has three first conducting terminals 110, and if the second electronic component 17 is a metal-oxide-semiconductor field-effect transistor (MOSFET), the second electronic component 17 has three second conducting terminals 170. For example, as shown in FIG. 5, the first electronic component 11a is a metal-oxide-semiconductor field-effect transistor (MOSFET) with three first conducting terminals 110, and the second electronic component 17a is a metal-oxide-semiconductor field-effect transistor (MOSFET) with three second conducting terminals 170. Moreover, if the first electronic component 11 is a capacitor, a resistor or a diode, the first electronic component 11 has two first conducting terminals 110, and if the second electronic component 17 is a capacitor, a resistor or a diode, the second electronic component 17 has two second conducting terminals 170. For example, as shown in FIG. 5, the first electronic component 11b is a diode and the first electronic component 11c is a capacitor or a resistor, and the second electronic component 17c is a capacitor or a resistor. Alternatively, the first electronic component 11 and the second electronic component 17 are integrated circuits (IC). In case that the first electronic component 11 and the second electronic component 17 are integrated circuits (IC), the numbers of the first conducting terminals 110 and the second conducting terminals 170 are determined according to the configurations of the integrated circuits. For example, as shown in FIG. 2, the second electronic component 17b has four second conducting terminals 170. It is noted that the first electronic components 11 and the second electronic components 17 disposed in the package structure 5 are not limited to the types shown in FIG. 2 and can be varied according to the practical requirements.

In this embodiment, as shown in FIG. 2, at least one thermal conduction structure 14 is located at horizontal side of every first electronic component 11. That is, one first electronic component 11 is arranged at every two adjacent thermal conduction structures 14.

Figure 3:
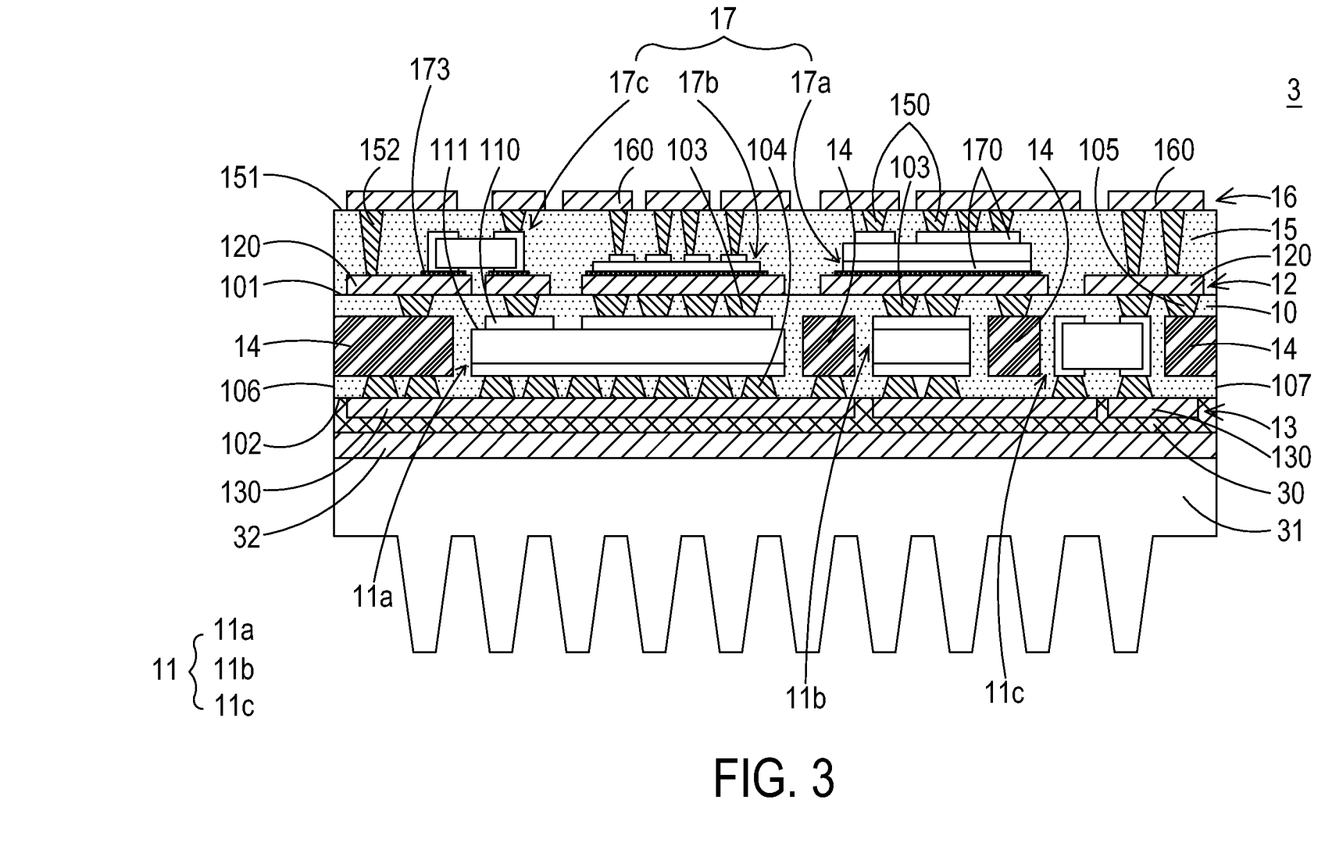
FIG. 3 is a schematic cross-sectional view illustrating a package structure according to a third embodiment of the present invention.

FIG. 3 is a schematic cross-sectional view illustrating a package structure according to a third embodiment of the present invention. In comparison with the second embodiment shown in FIG. 2, the package structure 3 of this embodiment further includes an insulating and heat-dissipating layer 30 and a heat dissipation device 31. The heat dissipation device 31 is located at an outer side of the second conductive layer 13 for enhancing the heat dissipating efficacy of the second conductive layer 13. The heat dissipation device 31 may be a passive heat dissipation device or an active heat dissipation device. An example of the passive heat dissipation device includes but not limited to a heat sink made of metallic material or ceramic material. An example of the active heat dissipation device includes but not limited to cooling water or heat pipe. The insulating and heat-dissipating layer 30 is arranged between the heat dissipation device 31 and the second conductive layer 13. Namely, the insulating and heat-dissipating layer 30 is disposed on an outer surface of the second conductive layer 13, covering the second conductive layer 13 and in contact with the heat dissipation device 31. Due to the insulating and heat-dissipating layer 30, the first conducting terminals 110 of the first electronic component 11 and the second conductive layer 13 are isolated from the heat dissipation device 31. In addition, after the heat is transferred to the second conductive layer 13, the heat may be further transferred to the heat dissipation device 31 through the insulating and heat-dissipating layer 30. More especially, since the package structure 3 can withstand a high voltage, the possibility of causing current leakage and high-voltage spark will be minimized.

Moreover, the package structure 3 further includes a metal layer 32. The metal layer 32 is arranged between the insulating and heat-dissipating layer 30 and the heat dissipation device 31. Namely, the metal layer 40 is disposed on an outer surface of the insulating and heat-dissipating layer 30 and in contact with the heat dissipation device 31. Due to the metal layer 32, the heat from the insulating and heat-dissipating layer 30 can be transferred to the heat dissipation device 31 more uniformly. Consequently, the heat dissipating efficacy is further increased.

Figure 4:
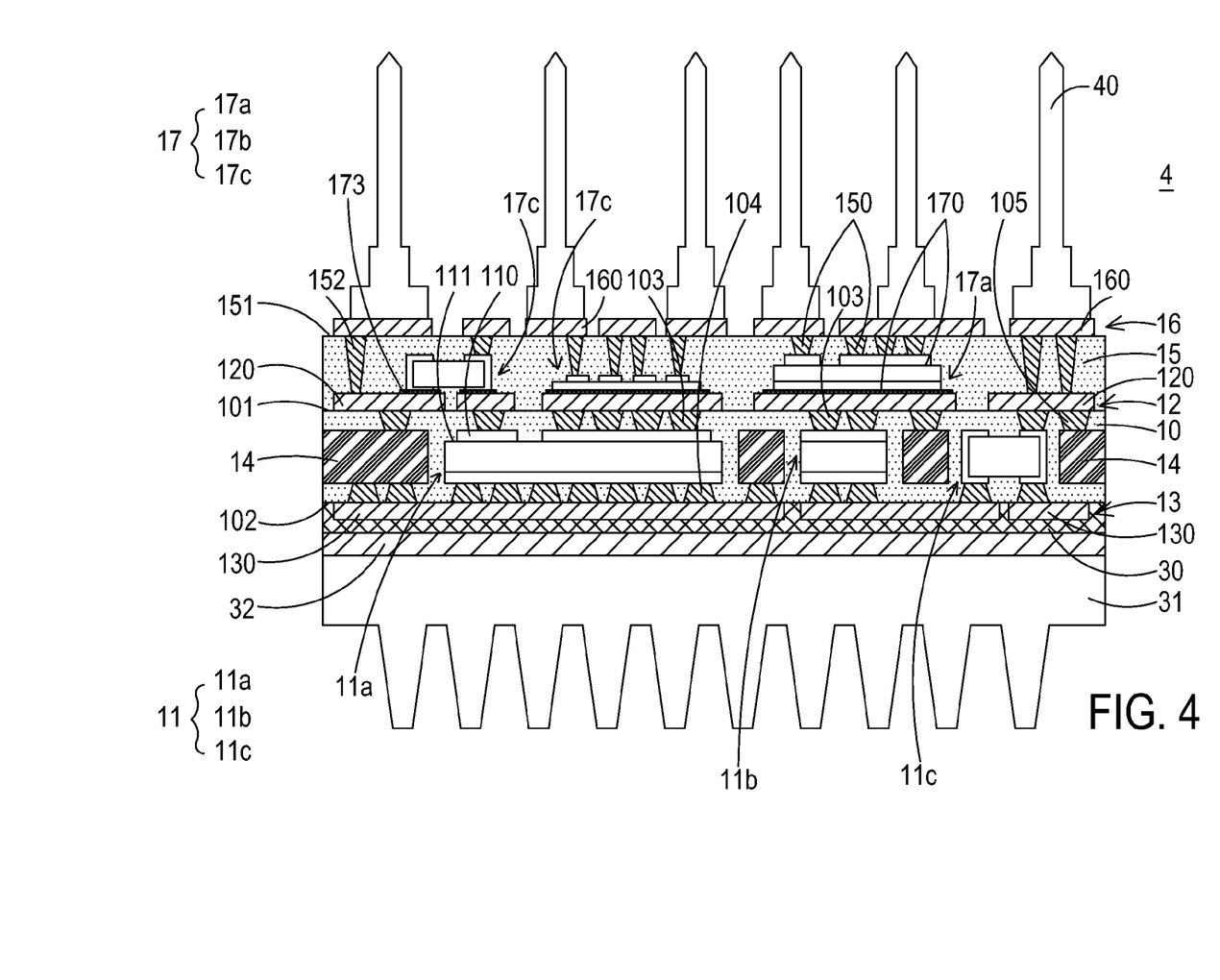
FIG. 4 is a schematic cross-sectional view illustrating a package structure according to a fourth embodiment of the present invention.

FIG. 4 is a schematic cross-sectional view illustrating a package structure according to a fourth embodiment of the present invention. In comparison with the third embodiment shown in FIG. 3, the package structure 4 of this embodiment further includes at least one pin 40. Said at least one pin 40 is disposed on and connected with the corresponding third conductive pattern 160 of the third conductive layer 16. Said at least one pin 40 is connected with the corresponding third conductive pattern 160 of the third conductive layer 16 by, for example, a solder paste soldering process, a ultrasonic welding process, a hot pressure welding process, an electric welding process or a mechanical embedding process, but it is not limited thereto. The package structure 4 can be fixed and connected with a system circuit board by inserting the pin 40 into the system circuit board and welding the pin 40 on the system circuit board.

FIG. 5 is a schematic cross-sectional view illustrating a package structure according to a fifth embodiment of the present invention. In comparison with the second embodiment shown in FIG. 2, the package structure 5 of this embodiment further includes at least one third electronic component 50. The third electronic component 50 is disposed on the third conductive layer 16. The third electronic component 50 includes plural third conducting terminals 500. The plural third conducting terminals 500 are contacted with corresponding third conductive patterns 160. Moreover, the plural third conducting terminals 500 are fixed on corresponding third conductive patterns 160 via solder paste 51. Consequently, the power density of the package structure 5 is enhanced.

Figure 6:
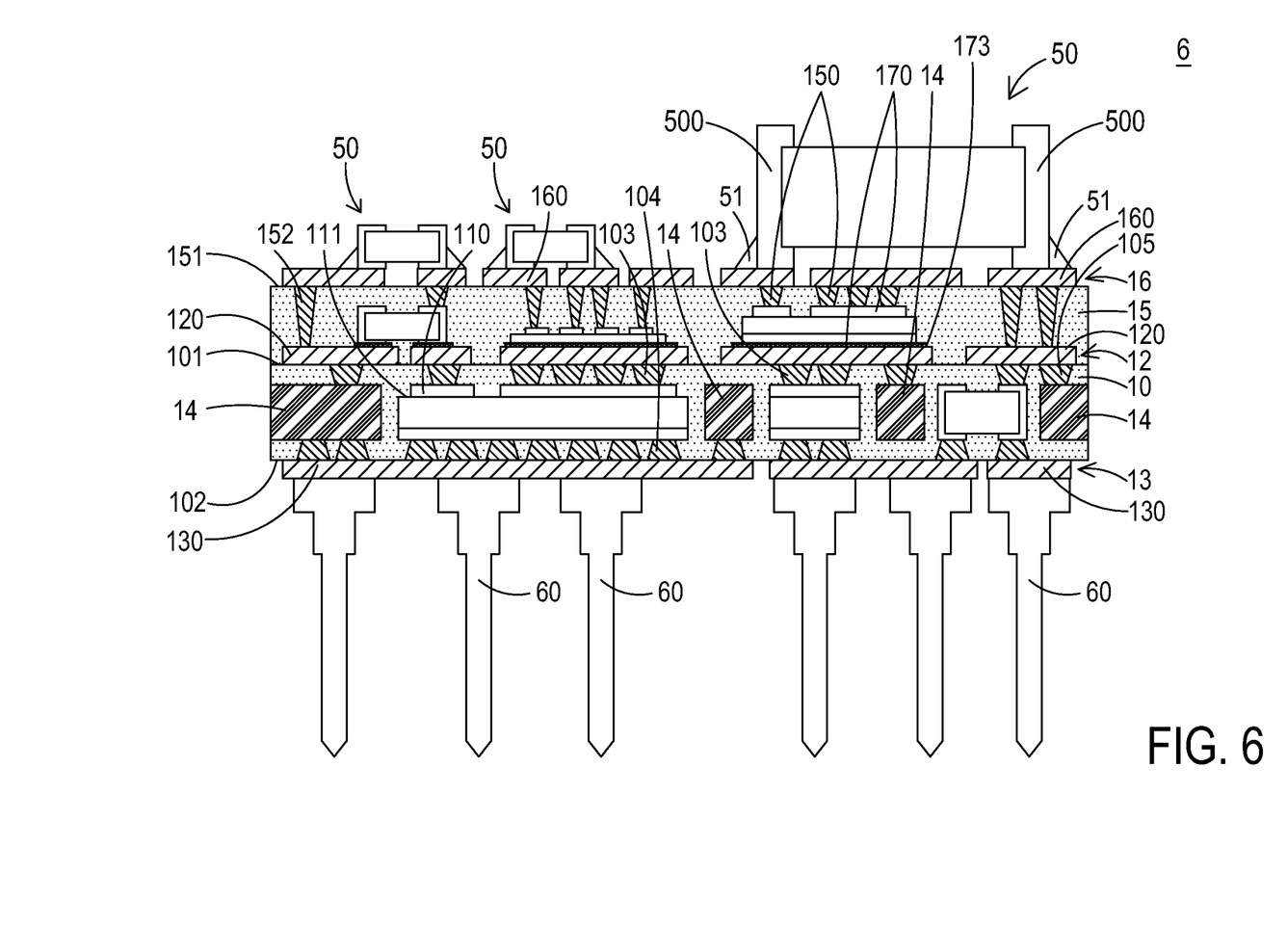
FIG. 6 is a schematic cross-sectional view illustrating a package structure according to a sixth embodiment of the present invention.

FIG. 6 is a schematic cross-sectional view illustrating a package structure according to a sixth embodiment of the present invention. In comparison with the fifth embodiment shown in FIG. 5, the package structure 5 of this embodiment further includes at least one pin 60. Said at least one pin 60 is disposed on and connected with the corresponding second conductive pattern 130 of the second conductive layer 13. Said at least one pin 60 is connected with the corresponding second conductive pattern 130 by, for example, a solder paste soldering process, a ultrasonic welding process, a hot pressure welding process, an electric welding process or a mechanical embedding process, but it is not limited thereto. The package structure 6 can be fixed and connected with a system circuit board by inserting the pin 60 into the system circuit board and welding the pin 60 on the system circuit board.

Figure 7:
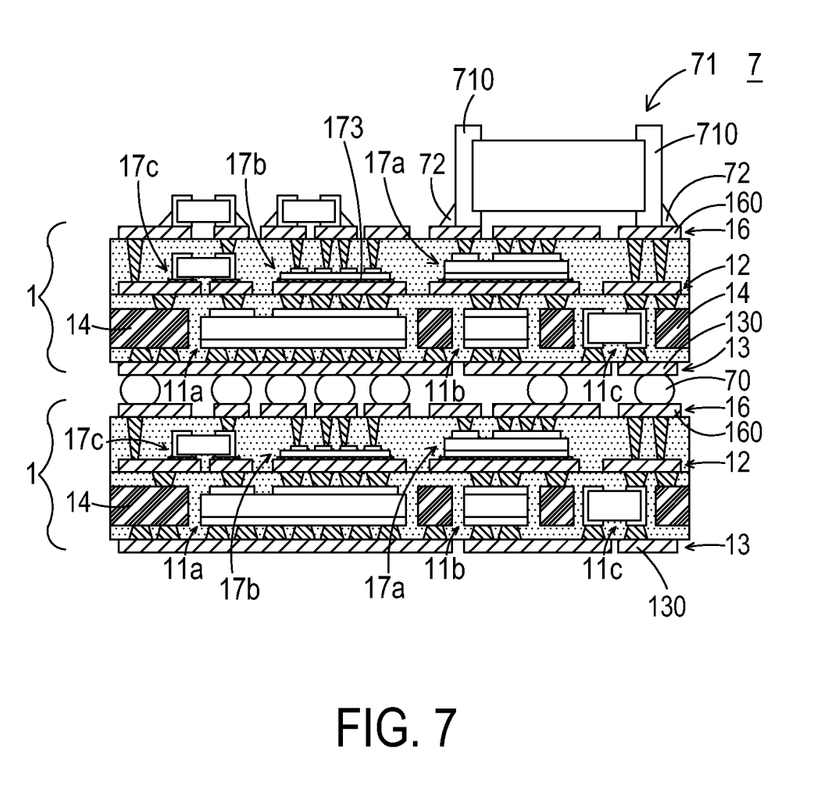
FIG. 7 is a schematic cross-sectional view illustrating a stacked package module according to a first embodiment of the present invention.

FIG. 7 is a schematic cross-sectional view illustrating a stacked package module according to a first embodiment of the present invention. As shown in FIG. 7, the stacked package module 7 includes plural package structures 2. The configurations of each package structure 2 are similar to those of the package structure 2 of FIG. 2, and are not redundantly described herein. Component parts and elements corresponding to those of FIG. 2 are designated by identical numeral references, and detailed descriptions thereof are omitted. As shown in FIG. 7, the plural package structures 2 are stacked on each other. Namely, one package structure 2 is stacked on the upper side of the adjacent package structure 2. The second conductive layer 13 of each package structure 2 is electrically connected with the third conductive layer 16 of the adjacent package structure 2. More especially, the corresponding second conductive pattern 130 of the second conductive layer 13 of the package structure 2 at the higher level is fixed on and electrically connected with the corresponding third conductive pattern 160 of the third conductive layer 16 of the package structure 2 at the lower level. Since the plural package structures 2 are stacked on each other, the stacked package module 7 has increased high density integration and enhanced power density.

More especially, the corresponding second conductive pattern 130 of the second conductive layer 13 of the package structure 2 at the higher level is fixed on and electrically connected with the corresponding third conductive pattern 160 of the third conductive layer 16 of the package structure 2 at the lower level through solder balls 70. Moreover, the stacked package module 7 further includes at least one third electronic component 71. The third electronic component 71 is disposed on the third conductive layer 16 of the topmost package structure 2. The third electronic component 71 includes plural third conducting terminals 710. The plural third conducting terminals 710 are contacted with corresponding third conductive patterns 160 of the third conductive layer 16 of the topmost package structure 2. Moreover, the plural third conducting terminals 710 are fixed on corresponding third conductive patterns 160 via solder paste 72. Consequently, the power density of the stacked package module 7 is enhanced.

Figure 8:
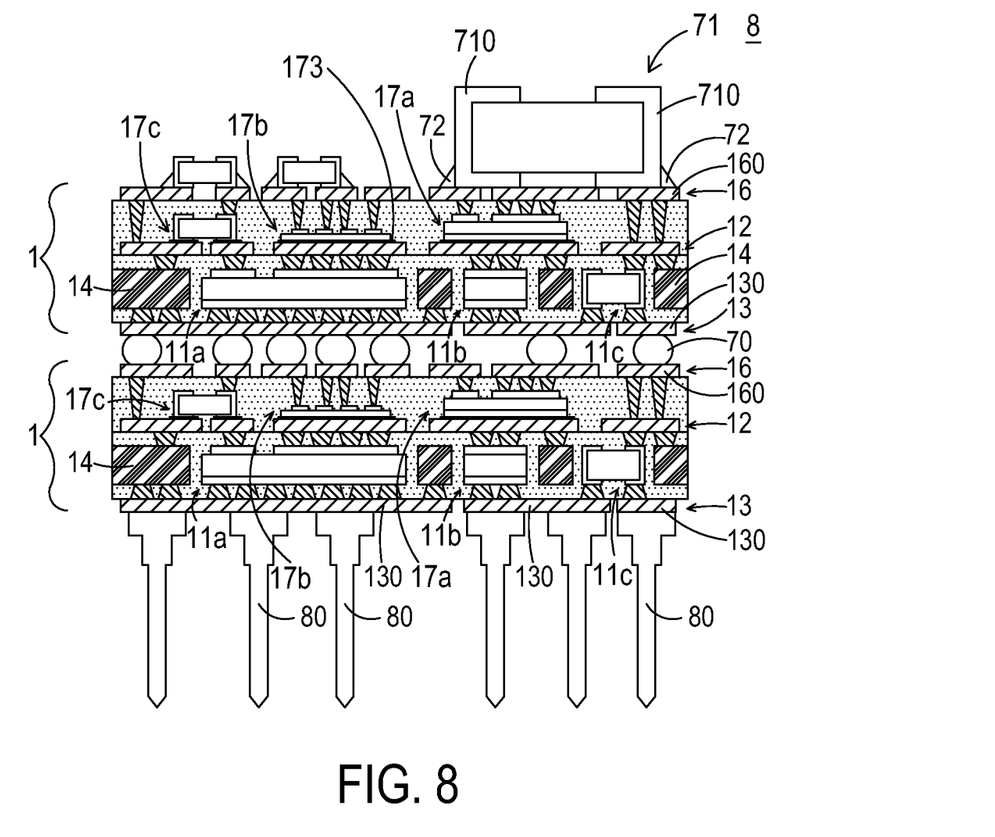
FIG. 8 is a schematic cross-sectional view illustrating a stacked package module according to a second embodiment of the present invention.

FIG. 8 is a schematic cross-sectional view illustrating a stacked package module according to a second embodiment of the present invention. In comparison with the first embodiment shown in FIG. 7, the stacked package module 8 of this embodiment further includes at least one pin 80 made of metallic material. Said at least one pin 80 is disposed on and connected with the corresponding second conductive pattern 130 of the second conductive layer 13 of the bottommost package structure 2. Said at least one pin 80 is connected with the corresponding second conductive pattern 130 by, for example, a solder paste soldering process, a ultrasonic welding process, a hot pressure welding process, an electric welding process or a mechanical embedding process, but it is not limited thereto. The package structure 8 can be fixed and connected with a system circuit board by inserting the pin 80 into the system circuit board and welding the pin 80 on the system circuit board.

From the above descriptions, the present invention provides a package structure and a stacked package module with the package structure. The package structure is a multilayered structure including plural insulation layers. At least one electronic component is embedded within the corresponding insulation layer. Since the electronic components are located at different levels with respect to the printed circuit board, the distance between the electronic components is effectively shortened. Under this circumstance, the on-resistance is effectively reduced, the parasitic effect is reduced, the electrical property is enhanced, and the overall power density of the package structure is increased. The plural conducting terminals of the electronic component are electrically connected with the corresponding conductive layers through corresponding conductive vias. At least one thermal conduction structure is partially embedded within the insulation layer, and located at said at least one lateral side of the electronic component, for example, two thermal conduction structures are located at horizontal sides of the electronic component. Consequently, the heat generated by the electronic component can be transferred to the surroundings of the package structure through the low thermal resistance paths of the conductive layers and said at least one thermal conduction structure along vertical and horizontal directions. In comparison with the conventional technology, the heat dissipating efficacy of the package structure of the present invention is largely enhanced. Moreover, since the third conductive layer is disposed on the top surface of the second insulation layer and the second conductive layer is disposed on the bottom surface of the first insulation layer, the package structure has the functions of bilaterally conducting electricity and multi-laterally dissipating heat. Moreover, since the electronic components are directly embedded within the insulation layers and the conducting terminals of the electronic components are electrically connected with the corresponding conductive patterns through corresponding conductive vias, the fabricating cost of the package structure is reduced and the use life of the package structure is prolonged. Moreover, since the thermal conduction structures are embedded within the insulation layer and implemented by the metallic lead frame, the overall mechanical strength of the package structure is increased, and the possibility of causing deformation of the package structure is minimized. Moreover, since the plural package structures are stacked on each other, the stacked package module has increased high density integration and enhanced power density.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A package structure, comprising:
    a first insulation layer, wherein at least one first conductive via and at least one second conductive via are formed in the first insulation layer;
    a first conductive layer disposed on a top surface of the first insulation layer and contacted with said at least one first conductive via;
    a second conductive layer disposed on a bottom surface of the first insulation layer and contacted with said at least one second conductive via;
    at least one first electronic component embedded within the first insulation layer, and comprising plural first conducting terminals, wherein the plural first conducting terminals are electrically connected with the first conductive layer and the second conductive layer through said at least one first conductive via and said at least one second conductive via;
    a second insulation layer disposed over the first conductive layer and covering the first conductive layer, wherein at least one third conductive via is formed in the second insulation layer;
    a third conductive layer disposed on a top surface of the second insulation layer and contacted with said at least one third conductive via; and
    at least one second electronic component embedded within the second insulation layer and connected to the first conductive layer via an adhesive material, and comprising plural second conducting terminals, wherein the plural second conducting terminals are electrically connected with the first conductive layer and/or electrically connected with the third conductive layer through said at least one third conductive via.

2. The package structure according to claim 1, further comprising at least one thermal conduction structure, wherein said at least one thermal conduction structure is embedded within the first insulation layer, and located at least one lateral side of said at least one first electronic component, wherein said at least one thermal conduction structure is partially exposed outside the first insulation layer, so that the heat generated by said at least one first electronic component is transferred to the surroundings of the package structure through said at least one thermal conduction structure.

3. The package structure according to claim 2, wherein said at least one first conductive via is formed in the first insulation layer, exposed to the top surface of the first insulation layer, and in contact with the first conductive layer; said at least one second conductive via is formed in the first insulation layer, exposed to the bottom surface of the first insulation layer, and in contact with the second conductive layer; said at least one third conductive via is formed in the second insulation layer, exposed to the top surface of the second insulation layer, and in contact with the third conductive layer.

4. The package structure according to claim 2, wherein said at least one thermal conduction structure is implemented by a metallic lead frame with electrical conduction and thermal conduction properties or a ceramic substrate with thermal conduction property.

5. The package structure according to claim 2, further comprising:
 a heat dissipation device, wherein the heat dissipation device is located on an outer surface of the second conductive layer;
 an insulating and heat-dissipating layer, wherein the insulating and heat-dissipating layer is arranged between the heat dissipation device and the second conductive layer; and
 a metal layer arranged between the insulating and heat-dissipating layer and the heat dissipation device.

6. The package structure according to claim 3, wherein said at least one first electronic component is arranged between said at least one first conductive via and said at least one second conductive via, and said at least one second electronic component is arranged between said at least one third conductive via and the first conductive layer.

7. The package structure according to claim 3, wherein the first conductive layer comprises at least one first conductive pattern, the second conductive layer comprises at least one second conductive pattern, and the third conductive layer comprises at least one third conductive pattern; said at least one first conductive pattern is contacted with said at least one first conductive via, said at least one second conductive pattern is contacted with said at least one second conductive via, and said at least one third conductive pattern is contacted with said at least one third conductive via.

8. The package structure according to claim 7, wherein the first electronic component has a top surface and a bottom surface, and the first conducting terminal formed on the top surface of the first electronic component is electrically connected with the corresponding first conductive pattern through the corresponding first conductive via, and the first conducting terminal formed on the bottom surface of the first electronic component is electrically connected with the corresponding second conductive pattern through the corresponding second conductive via.

9. The package structure according to claim 7, wherein the second electronic component has a top surface and a bottom surface, and the second conducting terminal formed on the top surface of the second electronic component is electrically connected with the corresponding third conductive pattern through the corresponding third conductive via, and the second conducting terminal formed on the bottom surface of the second electronic component is disposed on the corresponding first conductive pattern and electrically connected with corresponding first conductive pattern.

10. The package structure according to claim 7, wherein the first insulation layer further comprises a fourth conductive via; a first end of the fourth conductive via is contacted with one of the corresponding first conductive pattern and the corresponding second conductive pattern, and a second end of the fourth conductive via is contacted with the corresponding at least one thermal conduction structure.

11. The package structure according to claim 7, wherein said at least one thermal conduction structure comprises a plurality of thermal conduction structures, and the thermal conduction structures are separated from each other; the first insulation layer further comprises a fifth conductive via and a sixth conductive via; a first end of the fifth conductive via is contacted with the corresponding first conductive pattern, and a second end of the fifth conductive via is contacted with the corresponding thermal conduction structure; a first end of the sixth conductive via is contacted with the corresponding second conductive pattern, and a second end of the sixth conductive via is contacted with the corresponding thermal conduction structure.

12. The package structure according to claim 7, wherein the second insulation layer further comprises a seventh conductive via; a first end of the seventh conductive via is contacted with the corresponding third conductive pattern, and a second end of the seventh conductive via is contacted with the corresponding first conductive pattern.

13. The package structure according to claim 7, further comprising at least one third electronic component, wherein the third electronic component is disposed on the third conductive layer and comprises plural third conducting terminals; each third conducting terminal is disposed on the corresponding third conductive pattern.

14. The package structure according to claim 13, further comprising at least one pin, wherein said at least one pin is disposed on and connected with the corresponding second conductive pattern.

15. The package structure according to claim 7, further comprising at least one pin, wherein said at least one pin is disposed on and connected with the corresponding third conductive pattern.

16. A stacked package module, comprising:
 a plurality of package structures, each package structure comprising:
  a first insulation layer, wherein at least one first conductive via and at least one second conductive via are formed in the first insulation layer;
  a first conductive layer disposed on a top surface of the first insulation layer and contacted with said at least one first conductive via;
  a second conductive layer disposed on a bottom surface of the first insulation layer and contacted with said at least one second conductive via;
  at least one first electronic component embedded within the first insulation layer, and comprising plural first conducting terminals, wherein the plural first conducting terminals are electrically connected with the first conductive layer and the second conductive layer through said at least one first conductive via and said at least one second conductive via;
  a second insulation layer disposed over the first conductive layer and covering the first conductive layer, wherein at least one third conductive via is formed in the second insulation layer;
  a third conductive layer disposed on a top surface of the second insulation layer and contacted with said at least one third conductive via; and at least one second electronic component embedded within the second insulation layer and connected to the first conductive layer via an adhesive material, and comprising plural second conducting terminals, wherein the plural second conducting terminals are electrically connected with the first conductive layer and/or electrically connected with the third conductive layer through said at least one third conductive via;

wherein the plural package structures are stacked on each other, wherein the second conductive layer of each package structure is electrically connected with the third conductive layer of the adjacent package structure.

17. The stacked package module according to claim 16, wherein the first conductive layer comprises at least one first conductive pattern, the second conductive layer comprises at least one second conductive pattern, and the third conductive layer comprises at least one third conductive pattern; the corresponding second conductive pattern of the second conductive layer of the package structure at a higher level is electrically connected with the corresponding third conductive layer of the third conductive layer of the package structure at a lower level.

18. The stacked package module according to claim 17, wherein the second conductive layer of the package structure at the higher level is fixed on and electrically connected with the third conductive layer of the package structure at the lower level through solder balls.

19. The stacked package module according to claim 17, further comprising at least one third electronic component, wherein the third electronic component is disposed on the third conductive layer of the topmost package structure, and comprises plural third conducting terminals, wherein each third conducting terminal is connected on the corresponding third conductive pattern of the topmost package structure by soldering.

20. The stacked package module according to claim 17, further comprising at least one pin, wherein said at least one pin is disposed on and connected to the corresponding second conductive pattern of the bottommost package structure.

* * * * *